United States Patent
Kim et al.

(10) Patent No.: US 9,614,014 B2
(45) Date of Patent: Apr. 4, 2017

(54) DISPLAY DEVICE

(71) Applicant: Samsung Electronics Co., Ltd., Suwon-si, Gyeonggi-do (KR)

(72) Inventors: Sung-jin Kim, Suwon-si (KR); Ohyun Kwon, Suwon-si (KR); Jinhan Kim, Suwon-si (KR); Seongmin Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/501,882

(22) Filed: Sep. 30, 2014

(65) Prior Publication Data

US 2015/0092137 A1    Apr. 2, 2015

(30) Foreign Application Priority Data

Oct. 2, 2013 (KR) .......................... 10-2013-0118123

(51) Int. Cl.
*H01L 27/32* (2006.01)
*G02F 1/1335* (2006.01)
(Continued)

(52) U.S. Cl.
CPC .... *H01L 27/3232* (2013.01); *G02F 1/133603* (2013.01); *G09G 3/2003* (2013.01); *G09G 3/32* (2013.01); *G09G 3/3208* (2013.01); *G09G 3/3426* (2013.01); *G09G 3/3607* (2013.01); *H01L 27/15* (2013.01); *H01L 27/3225* (2013.01); *H01L 33/504* (2013.01);
(Continued)

(58) Field of Classification Search
CPC ........ G02F 1/133603; G02F 1/133617; G09G 2300/023; G09G 2300/0452; G09G 3/2003; G09G 3/32; G09G 3/3208; G09G 3/3426; G09G 3/3607; H01L 27/322; H01L 27/3225; H01L 27/3232; H01L 33/504

See application file for complete search history.

(56) References Cited

U.S. PATENT DOCUMENTS 5,683,823 A    11/1997    Shi et al.
7,893,612 B2    2/2011    Cok
(Continued)

FOREIGN PATENT DOCUMENTS

CN    103091895 A    5/2013
EP    1702370 A2    9/2006
(Continued)

OTHER PUBLICATIONS

J. Kido et al. "White lightemitting organic electroluminescent devices using the poly(Nvinylcarbazole) emitter layer doped with three fluorescent dyes" Applied Physics Letters 64, 815 (1994); doi: 10.1063/1.111023.
(Continued)

*Primary Examiner* — Donald Raleigh
*Assistant Examiner* — Kevin Quarterman
(74) *Attorney, Agent, or Firm* — Harness, Dickey, & Pierce, P.L.C.

(57) ABSTRACT

A display device includes a plurality of organic light-emitting diode (OLED) pixels on a substrate, and a plurality of light-emitting diode (LED) pixels between the plurality of OLED pixels on the substrate, the plurality of LED pixels on a same plane as the plurality of OLED pixels.

36 Claims, 15 Drawing Sheets

(51) Int. Cl.
  *H01L 27/15* (2006.01)
  *H01L 33/50* (2010.01)
  *G09G 3/20* (2006.01)
  *G09G 3/32* (2016.01)
  *G09G 3/3208* (2016.01)
  *G09G 3/34* (2006.01)
  *G09G 3/36* (2006.01)

(52) U.S. Cl.
  CPC .... *G02F 1/133617* (2013.01); *G02F 2201/44* (2013.01); *G09G 2300/023* (2013.01); *G09G 2300/0452* (2013.01)

(56) References Cited

U.S. PATENT DOCUMENTS

| | | | |
|---|---|---|---|
| 8,547,406 B2 | 10/2013 | Bitman et al. | |
| 2005/0062903 A1* | 3/2005 | Cok | B82Y 10/00 349/69 |
| 2007/0058107 A1 | 3/2007 | Im et al. | |
| 2007/0081321 A1* | 4/2007 | Ahn | G02B 6/0068 362/97.3 |
| 2008/0048560 A1* | 2/2008 | Sung | H01L 27/3213 313/504 |
| 2008/0174721 A1 | 7/2008 | Zhou | |
| 2009/0206733 A1* | 8/2009 | Hwang | H01L 51/5268 313/504 |
| 2010/0128202 A1 | 5/2010 | Chu Ke et al. | |
| 2012/0154464 A1* | 6/2012 | Ninan | G02B 27/2264 345/691 |
| 2012/0287381 A1* | 11/2012 | Li | G02F 1/133617 349/106 |
| 2013/0020933 A1 | 1/2013 | Levermore et al. | |
| 2013/0335677 A1* | 12/2013 | You | G02F 1/133609 349/65 |
| 2014/0078716 A1* | 3/2014 | Ninan | F21V 9/10 362/84 |
| 2014/0184940 A1* | 7/2014 | Ma | G02F 1/13338 349/12 |
| 2014/0204319 A1 | 7/2014 | Cai et al. | |
| 2014/0268633 A1* | 9/2014 | Kwon | G09G 3/2025 362/84 |
| 2014/0355307 A1* | 12/2014 | Sah | G02F 1/133603 362/613 |
| 2015/0062490 A1* | 3/2015 | Kwon | G02F 1/133621 349/64 |

FOREIGN PATENT DOCUMENTS

| | | |
|---|---|---|
| EP | 1762887 A1 | 3/2007 |
| JP | 3451680 B2 | 9/2003 |
| JP | 2013026224 A | 2/2013 |
| KR | 100999446 B1 | 12/2010 |
| KR | 20110054989 A | 5/2011 |
| WO | WO-2013/126273 A1 | 8/2013 |

OTHER PUBLICATIONS

J. Kido et al. "Multilayer White Light-Emitting Organic Electroluminescent Device" Science, vol. 267, Mar. 3, 1995.
Partial European Search Report dated Feb. 5, 2015 issued in corresponding European Application No. 14187125.1.
European Search Report Application No. 14187125.1 dated Dec. 12, 2015.
Nano Lett., Hybrid Silicon Nanocone—Polymer Solar Cells, 2012, 12 (6), pp. 2971-2976 (Yi Cui. et al, Stanford University).

* cited by examiner

_US 9,614,014 B2_

DISPLAY DEVICE

CROSS REFERENCE TO RELATED APPLICATIONS

This application claims the benefit of Korean Patent Application No. 10-2013-0118123, filed on Oct. 2, 2013, in the Korean Intellectual Property Office, the disclosure of which is incorporated herein in its entirety by reference.

BACKGROUND

1. Field

Some example embodiments relate to display devices. Other example embodiments relate to a display device that is a combination of an organic light-emitting diode (OLED) display device and a liquid crystal display (LCD) device that includes a light-emitting diode backlight unit.

2. Description of the Related Art

An organic light-emitting diode (OLED) display device is an active light-emitting display device. The OLED utilizes a phenomenon that when current is supplied to an organic emission layer formed of a fluorescent or phosphorescent organic compound, electrons and holes are combined in the organic emission layer to emit light. The OLED display device is capable of performing high-precision light emission and thus displaying a high-quality moving picture. Also, the OLED display device has a relatively wide viewing angle and is capable of being driven with relatively low power consumption. Also, the OLED display device may be manufactured to be relatively thin, thereby being easier to be manufactured as a flexible display device.

A liquid crystal display (LCD) device is a passive light-emitting display device in which an image is formed when light is incident on a liquid crystal layer from a backlight unit. Recently, a backlight unit that uses a light-emitting diode (LED) as a light source has been developed as a backlight unit for use in LCD devices. An LCD device that employs the backlight unit using the LED has relatively high color reproducibility.

SUMMARY

Example embodiments provide a display device that is a combination of an organic light-emitting diode (OLED) display device and a liquid crystal display (LCD) device that includes a backlight unit.

Additional aspects will be set forth in part in the description which follows and, in part, will be apparent from the description, or may be learned by practice of example embodiments.

According to example embodiments, a display device includes a plurality of organic light-emitting diode (OLED) pixels on a substrate, and a plurality of light-emitting diode (LED) pixels between the plurality of OLED pixels on the substrate, the plurality of LED pixels on a same plane as the plurality of OLED pixels. The plurality of OLED pixels may be configured to emit light of a primary color, and the plurality of LED pixels may be configured to emit blue light.

The plurality of OLED pixels may include a first electrode and a second electrode spaced apart from each other, and an organic emission layer between the first and second substrates and configured to emit light of the primary color. Also, the plurality of OLED pixels may include a first electrode and a second electrode spaced apart from each other, a white organic emission layer between the first and second substrates and configured to emit white light, and a color filter on the second electrode and configured to allow light of the primary color to pass therethrough.

The plurality of LED pixels may include a white backlight unit configured to emit white light, and a liquid crystal panel. The liquid crystal panel may include a liquid crystal layer configured to allow the white light incident thereon from the white backlight unit to pass therethrough, and a blue color filter configured to transform the white light passing through the liquid crystal layer into blue light. The white backlight unit may include a blue LED light source, and red and green quantum dots excited by the blue light emitted from the blue LED light source to emit red light and green light, respectively. Also, the plurality of LED pixels may include a blue backlight unit configured to emit blue light, and a liquid crystal panel including a liquid crystal layer configured to allow the blue light incident thereon from the blue backlight unit to pass therethrough The plurality of OLED pixels may be configured to emit light of a primary color, and the plurality of LED pixels may be configured to emit white light. The plurality of LED pixels may include a white backlight unit configured to emit white light, and a liquid crystal panel including a liquid crystal layer configured to allow the white light incident thereon from the white backlight unit to pass therethrough.

The plurality of OLED pixels may be configured to emit white light, and the plurality of LED pixels may be configured to emit light of a primary color. The plurality of OLED pixels may include a first electrode and a second electrode spaced apart from each other, and a white organic emission layer between the first and second electrodes and configured to emit white light. The plurality of LED pixels may include a white backlight unit configured to emit white light, and a liquid crystal panel. The liquid crystal panel may include a liquid crystal layer configured to allow the white light incident thereon from the white backlight unit to pass therethrough, and a color filter configured to transform the white light passing through the liquid crystal layer into the light of the primary color. The plurality of LED pixels may include a backlight unit configured to emit the light of the primary color, and a liquid crystal layer configured to allow the light of the primary color incident thereon from the backlight unit to pass therethrough.

According to example embodiments, a display device includes a first substrate and a second substrate spaced apart from and facing each other, a plurality of organic light-emitting diode (OLED) pixels on the first substrate, a plurality of light-emitting diode (LED) pixels on the second substrate and a plurality of blank pixels on the first substrate corresponding with the plurality of LED pixels on the second substrate and configured to allow light to pass therethrough.

Light emitted from the plurality of LED pixels may be emitted via the plurality of blank pixels. The plurality of blank pixels may include through-holes in the first substrate.

According to example embodiments, a display device includes a first substrate and a second substrate spaced apart from and facing each other, a plurality of red and green organic light-emitting diode (OLED) pixels on the first substrate and configured to emit red light and green light, respectively, a plurality of blank pixels on the first substrate and configured to allow blue light to pass therethrough, a reflecting plate between the first and second substrates and including first through-holes corresponding to the plurality of blank pixels, and a blue light emission unit on the second substrate and configured to emit blue light.

The blue light emission unit may include a blue backlight unit including at least one blue LED light source, and a liquid crystal panel including a liquid crystal layer for allowing the blue light emitted from the blue backlight unit to pass therethrough.

According to example embodiments, a display device includes a plurality of organic light-emitting diode (OLED) pixels on a substrate, and a plurality of light-emitting diode (LED) pixels between the plurality of OLED pixels, the plurality of LED pixels including a backlight unit including a blue LED light source, and a liquid crystal panel including a liquid crystal layer configured to allow the light incident thereon from the backlight unit to pass therethrough.

The backlight unit may further include red and green quantum dots excited by the blue light emitted from the blue LED light source to emit red light and green light, respectively. The backlight unit may be configured to emit white light, and the liquid crystal panel may further include a blue color filter configured to transform the white light passing through the liquid crystal layer into blue light. The backlight unit may be configured to emit blue light.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
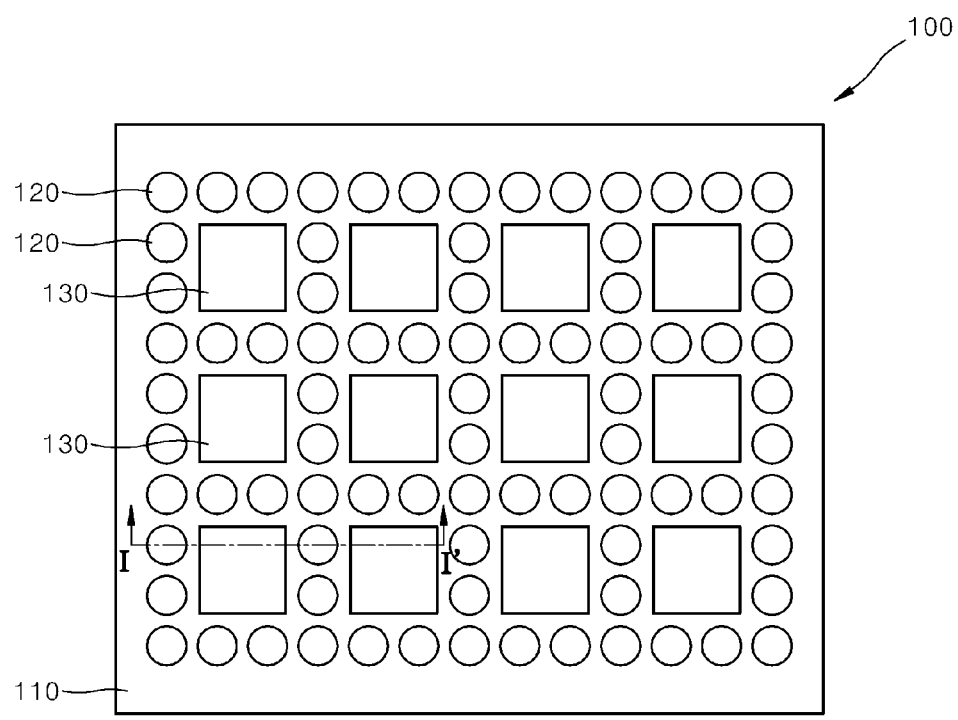
FIG. 1 is a schematic plan view of a display device according to example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The embodiments set forth herein are not intended to limit the scope of the present inventive concepts and are provided to describe the present inventive concepts to those of ordinary skill in the art. In the drawings, the size or thickness of each element may be exaggerated for clarity. Also, it will be understood that when a layer is referred to as being "on" another layer or substrate, it can be directly on the other layer or substrate, or intervening layers may also be present. Also, a material of each layer is illustrated in the embodiments set forth herein and other various materials may be used to form the layer. As used herein, the term "and/or" includes any and all combinations of one or more of the associated listed items.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
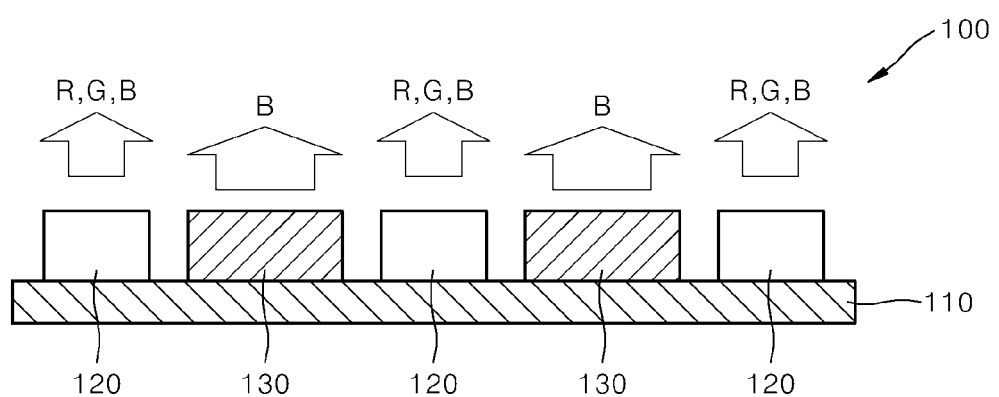
FIG. 2 is a cross-sectional view taken along line I-I' of FIG. 1.

FIG. 1 is a schematic plan view of a display device 100 according to example embodiments. FIG. 2 is a cross-sectional view taken along line I-I' of FIG. 1.

Referring to FIGS. 1 and 2, the display device 100 includes a substrate 110, and an organic light-emitting display device and a liquid crystal display (LCD) device that are placed on the substrate 110. The organic light-emitting display device includes a plurality of organic light-emitting diode (OLED) pixels 120 disposed on the substrate 110, and the LCD device includes a plurality of light-emitting diode (LED) pixels 130 disposed between the OLED pixels 120 disposed on the substrate 110. The LED pixels 130 include a backlight unit (see FIG. 5) that uses an LED as a light source. Various types of substrates may be used as the substrate 110. For example, a flexible substrate (e.g., a plastic substrate) or a hard substrate (e.g., a glass substrate) may be used as the substrate 110. The OLED pixels 120 and the LED pixels 130 may be disposed on the same plane of the substrate 110. Each of the OLED pixels 120 emits light of a given (or, alternatively predetermined) primary color (i.e., red, green, or blue light). For example, when one of the OLED pixels 120 is a red pixel that emits red light, OLED pixels 120 disposed around the red pixel may be green pixels that emit green light and blue pixels that emit blue light. The LED pixels 130 emit blue light.

Figure 3:
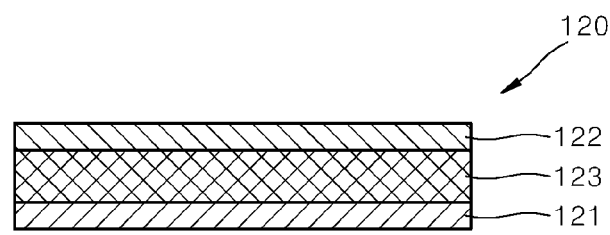
FIG. 3 is a cross-sectional view of an organic light-emitting diode (OLED) pixel of FIG. 2.

FIG. 3 is a cross-sectional view of the OLED 120 pixel of FIG. 2. Referring to FIG. 3, the OLED pixel 120 includes a first electrode 121 and a second electrode 122 spaced apart from each other, and an organic emission layer 123 placed between the first and second electrodes 121 and 122. The first and second electrodes 121 and 122 may be an anode electrode and a cathode electrode, respectively. In example embodiments, the first electrode 121 may include, for example, a transparent conductive material (e.g., an indium tin oxide (ITO), an indium zinc oxide (IZO), SnO$_2$, or ZnO), but is not limited thereto. The second electrode 122 may include, for example, a metal (e.g., Al, Ag, Mg, Li, or Ca or an alloy thereof), but is not limited thereto. Alternatively, the first and second electrodes 121 and 122 may be a cathode electrode and an anode electrode, respectively. One of the first and second electrodes 121 and 122 may be a common electrode and the other may be a pixel electrode. In example embodiments, the pixel electrode is connected to a thin film transistor (TFT) (not shown) capable of selectively driving the OLED pixels 120.

The organic emission layer 123 that emits light of the given (or, alternatively predetermined) primary color is placed between the first and second electrodes 121 and 122. The organic emission layer 123 may be, for example, a red, green, or blue light-emitting layer. When the TFT is driven to cause current to flow between the first and second electrodes 121 and 122, holes flow from the first electrode 121 (which is an anode electrode) into the organic emission layer 123 and electrons flow from the second electrode 122 (which is a cathode electrode) into the organic emission layer 123. Thus, the holes and the electrons are combined in the organic emission layer 123 to emit light of a given (or, alternatively predetermined) color (e.g., red, green, or blue light). The emitted light of the given (or, alternatively predetermined) color may be emitted to the external environment via the second electrode 122.

A reflecting plate (not shown) may be placed on the substrate 110 to reflect the light of the given (or, alternatively predetermined) color emitted from the organic emission layer 123 toward the second electrode 122. Although not shown, a hole injection layer and/or a hole transport layer may be further placed between the first electrode 121 (which is an anode electrode) and the organic emission layer 123, and an electron injection layer and/or an electron transport layer may be further placed between the second electrode 122 (which is a cathode electrode) and the organic emission layer 123.

Figure 4:
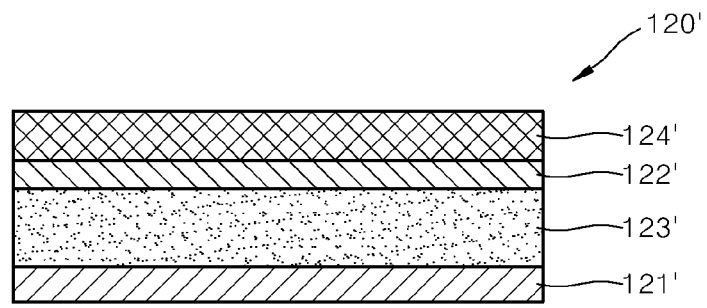
FIG. 4 is a cross-sectional view of a modified example of the OLED pixel of FIG. 2.

FIG. 4 is a cross-sectional view of an OLED pixel 120' that is a modified example of the OLED pixel 120 of FIG. 2. Referring to FIG. 4, the OLED pixel 120' includes a first electrode 121' and a second electrode 122' spaced apart from each other, a white organic emission layer 123' placed between the first and second electrodes 121' and 122', and a color filter 124' placed on the second electrode 122'. The white organic emission layer 123' emits white light when current is supplied between the first and second electrodes 121' and 122', and may have a structure in which a plurality of emission layers (e.g., red, green, and blue emission layers) are stacked. The color filter 124' allows only light of a given (or, alternatively predetermined) color (e.g., red, green, or blue light) in the white light incident thereon from the white organic emission layer 123' to pass therethrough, and emits the light to the external environment.

Figure 5:
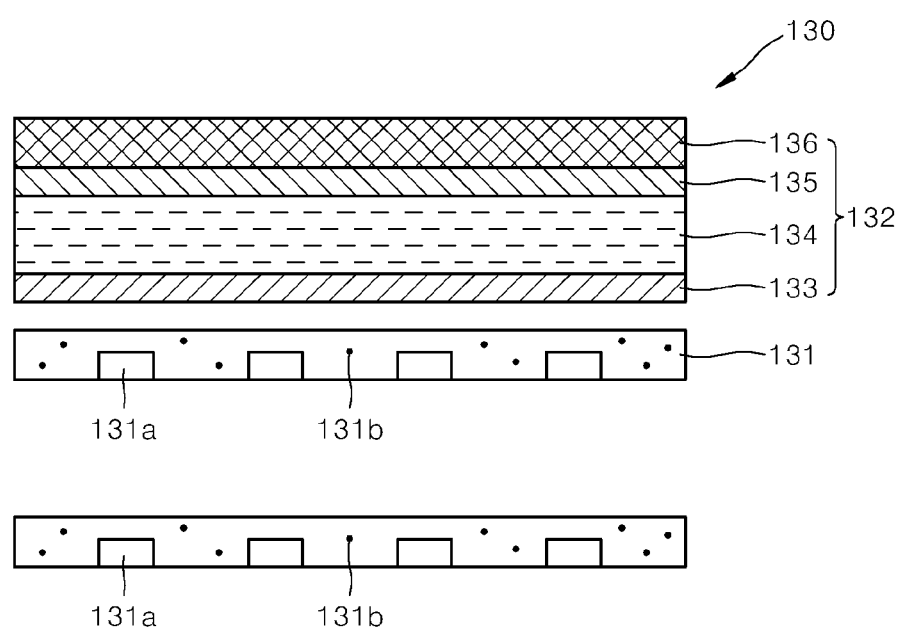
FIG. 5 is a cross-sectional view of a light-emitting diode (LED) pixel of FIG. 2.

FIG. 5 is a cross-sectional view of the LED pixel 130 of FIG. 2. Referring to FIG. 5, the LED pixel 130 includes a white backlight unit 131 that emits white light and a liquid crystal panel 132 that emits blue light using the white light incident thereon from the white backlight unit 131. The white backlight unit 131 includes an LED light source 131a. In detail, the white backlight unit 131 may include a blue LED light source 131a that emit blue light, and red and green quantum dots 131b excited by the blue light emitted from the blue LED light source 131a to emit red light and green light, respectively. When the white backlight unit 131 includes the blue LED light source 131a and the red and green quantum dots 131b as described above, the sensitivity for red may be increased to improve color reproducibility. The white backlight unit 131 may include either red, green, and blue LED light sources 131a, or a UV LED light source 131a and red, green, and blue fluorescent substances (not shown). Otherwise, the white backlight unit 131 may include the blue LED light source 131a and a yellow fluorescent substance (not shown).

White light emitted from the white backlight unit 131 is incident toward the liquid crystal panel 132. The liquid crystal panel 132 may include a first polarizing plate 133, a liquid crystal layer 134, a second polarizing plate 135, and a blue color filter 136. The liquid crystal layer 134 acts as an optical shutter and allows white light passing through the first polarizing plate 133 to selectively pass therethrough. Electrodes (not shown) are placed on upper and lower surfaces of the liquid crystal layer 134 to drive the liquid crystal layer 134. One of the electrodes is connected to the TFT. The blue color filter 136 allows only blue light in the white light passing through the liquid crystal layer 134 to pass therethrough, and emits the blue light to the external environment. Thus, the blue light may be emitted from the LED pixel 130.

Figure 6:
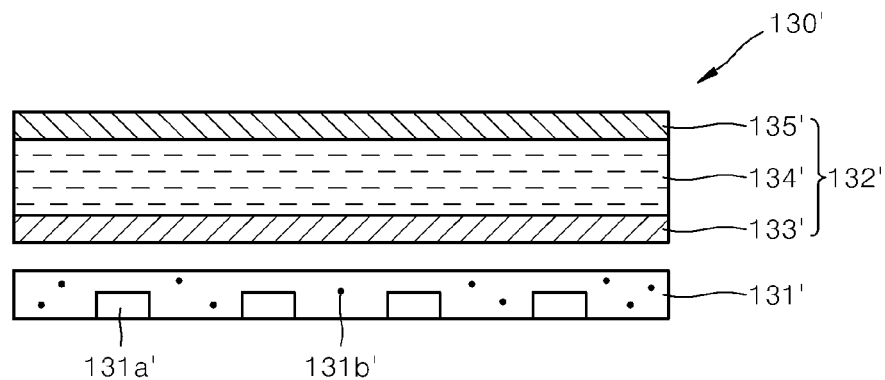
FIG. 6 is a cross-sectional view of a modified example of the LED pixel of FIG. 2.

FIG. 6 is a cross-sectional view of an LED pixel 130' that is a modified example of the LED pixel 130 of FIG. 2. Referring to FIG. 6, the LED pixel 130' includes a blue backlight unit 131 that emits blue light, and a liquid crystal panel 132' that allows the blue light incident thereon from the blue backlight unit 131' to selectively pass therethrough. The blue backlight unit 131' includes a blue LED light source 131$a$'. The blue light emitted from the blue backlight unit 131' is incident toward the liquid crystal panel 132'. The liquid crystal panel 132' may include a first polarizing plate 133', a liquid crystal layer 134', and a second polarizing plate 135'. The liquid crystal layer 134' acts as an optical shutter and allows blue light passing through the first polarizing plate 133' to selectively pass therethrough. Thus, the blue light may be emitted from the LED pixel 130'.

As described above, in the display device 100 according to example embodiments, the OLED pixels 120 (or 120') and the LED pixels 130 (or 130') are arranged on the same substrate 110. The OLED pixels 120 and 120' emit red light R, green light G, and blue light B, and the LED pixels 130 and 130' emit blue light B. In general, an organic light-emitting display device is capable of performing relatively high-precision light emission and being manufactured as a flexible display but has slightly lower color reproducibility for blue, thus shortening the lifespan of a blue pixel. According to example embodiments, a disadvantage of an organic light-emitting display device with respect to a blue pixel may be compensated for using the LED pixels 130 that emits blue light. That is, in the display device 100 according to example embodiments, the OLED pixels 120 that emit red light R, green light G, and blue light B are disposed on the substrate 110, and the LED pixels 130 that emit blue light B are disposed between the OLED pixels 120.

The OLED pixels 120 form an image, and the LED pixels 130 may compensate for or be replaced with the OLED pixels 120 that emit blue light. Thus, the color reproducibility for blue of an image may be improved and an image that approximates a real image may be formed. Also, the lifespan of the display device 100 may increase. Furthermore, when the white backlight unit 131 of the LED pixel 130 is manufactured using the blue LED light source 131$a$' and the red and green quantum dots 131$b$', color reproducibility may be improved. Although FIG. 1 illustrates a case in which the LED pixels 130 are arranged between the OLED pixels 120 in a regular pattern, the LED pixels 130 may be arranged in a random pattern.

Figure 7:
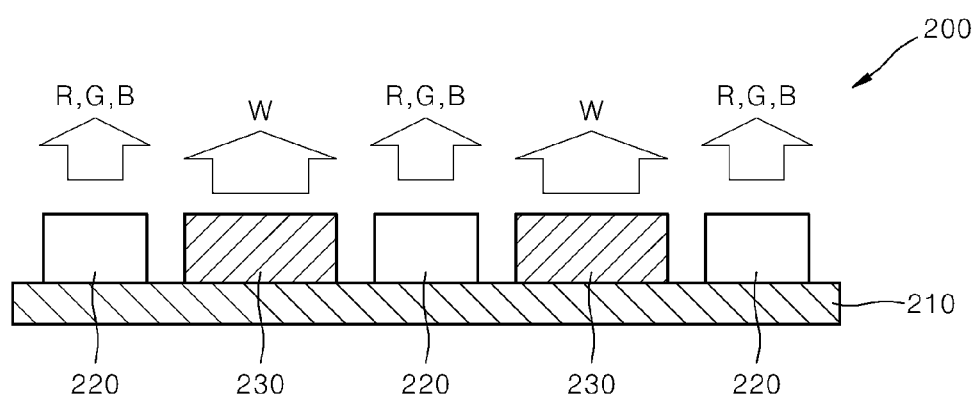
FIG. 7 is a cross-sectional view of a display device according to example embodiments.

FIG. 7 is a cross-sectional view of a display device 200 according to example embodiments. A plan view of the display device 200 illustrated in FIG. 7 is the same as that of the display device 100 of FIG. 1. The display device 200 will now be described focusing on the differences from the display device 100 according to example embodiments.

Referring to FIG. 7, the display device 200 includes a plurality of OLED pixels 220 and a plurality of LED pixels 230 placed on a substrate 210. The OLED pixels 220 and the LED pixels 230 may be disposed on the same plane of the substrate 210. The OLED pixels 220 emit red light R, green light G, and blue light B. The OLED pixels 220 are the same as the OLED pixel 120 of FIG. 3 or the OLED pixel 120' of FIG. 4 described above and are thus not redundantly described here. In example embodiments, the LED pixels 230 emit white light W.

Figure 8:
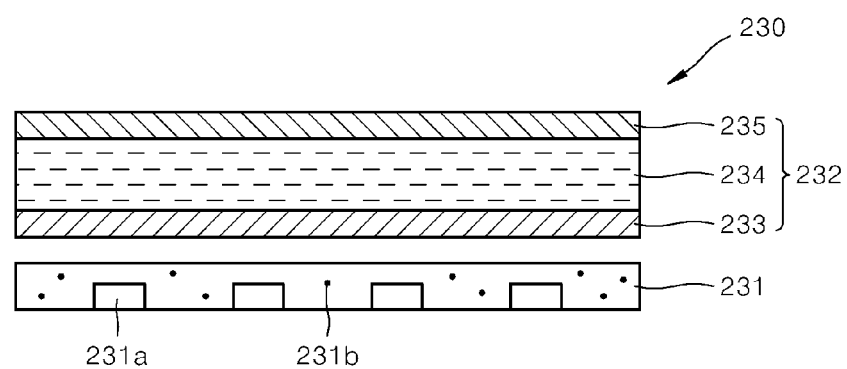
FIG. 8 is a cross-sectional view of an LED pixel of FIG. 7.

FIG. 8 is a cross-sectional view of the LED pixel 230 of FIG. 7. Referring to FIG. 8, the LED pixel 230 includes a white backlight unit 231 that emits white light, and a liquid crystal panel 232 that allows the white light emitted from the white backlight unit 231 to selectively pass therethrough. The white backlight unit 231 includes an LED light source 231$a$. In detail, the white backlight unit 231 may include a blue LED light source 231$a$ that emits blue light, and red and green quantum dots 231$b$ excited by the blue light emitted from the blue LED light source 231$a$ to emit red light and a green light. As described above, when the white backlight unit 231 includes the blue LED light source 231$a$ and the red and green quantum dots 231$b$, the sensitivity for red may be increased to improve color reproducibility. The white backlight unit 231 may include either red, green, and blue LED light sources 231$a$, or a UV LED light source 231$a$ and red, green, and blue fluorescent substances (not shown). Otherwise, the white backlight unit 231 may include the blue LED light source 231$a$ and a yellow fluorescent substance (not shown).

White light emitted from the white backlight unit 231 is incident toward the liquid crystal panel 232. The liquid crystal panel 232 may include a first polarizing plate 233, a liquid crystal layer 234, and a second polarizing plate 235. The liquid crystal layer 234 acts as an optical shutter, and allows white light incident thereon to selectively pass therethrough. Electrodes (not shown) are placed on upper and lower surfaces of the liquid crystal layer 234 to drive the liquid crystal layer 234, and one of the electrodes is connected to a TFT (not shown). Thus, white light W may be emitted from the LED pixel 230.

Because an organic light-emitting display device is limited in terms of brightness, problems (e.g., relatively high power consumption and relatively low lifespan thereof) may occur. According to example embodiments, relatively low brightness and lifespan of an organic light-emitting display device may be compensated for using the LED pixels 230 that emits white light. That is, in the display device 200 according to example embodiments, the OLED pixels 220 that emit red light R, green light G, and blue light B are disposed on the substrate 210, and the LED pixels 230 that emit white light W are disposed between the OLED pixels 220. The OLED pixels 220 form an image and the LED pixels 230 brighten the image. Thus, the brightness and lifespan of the display device 200 may increase. Furthermore, when the white backlight unit 231 of the LED pixel 230 is formed using the blue LED light source 231$a$ and the red and green quantum dots 231$b$, color reproducibility for white may be improved. The LED pixels 230 may be disposed between the OLED pixels 220 in a regular pattern or a random pattern.

Figure 9:
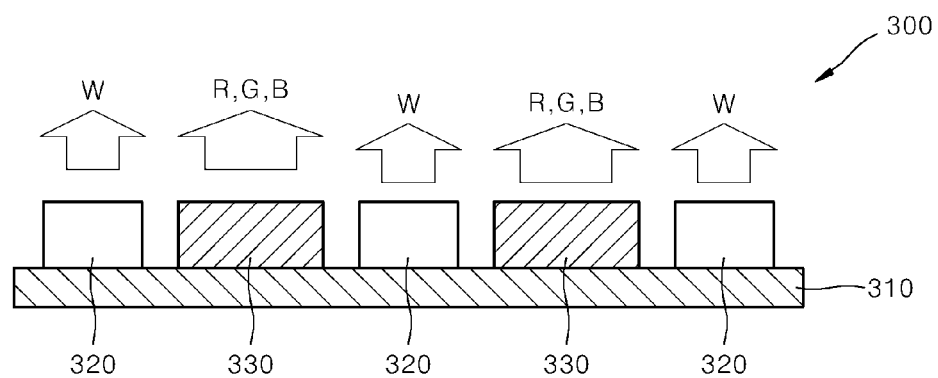
FIG. 9 is a cross-sectional view of a display device according to example embodiments.

FIG. 9 is a cross-sectional view of a display device 300 according to example embodiments. A plan view of the display device 300 illustrated in FIG. 9 is the same as that of the display device 100 illustrated in FIG. 1. The display device 300 will now be described focusing on the differences from the display devices 100 and 200 according to the previous embodiments.

Referring to FIG. 9, the display device 300 includes a plurality of OLED pixels 320 and a plurality of LED pixels 330 placed on a substrate 310. The OLED pixels 320 and the LED pixels 330 may be disposed on the same plane of the substrate 310. In example embodiments, the OLED pixels 320 emit white light W and the LED pixels 330 emit red light R, green light G, and blue light B. Each of the LED pixels 330 emits light of a given (or, alternatively predetermined) primary color, i.e., red light, green light, or blue light. For example, when one of the LED pixels 330 is a red pixel that emits red light, LED pixels 330 disposed around the red pixel may be a green pixel that emits green light and a blue pixel that emits blue light.

Figure 10:
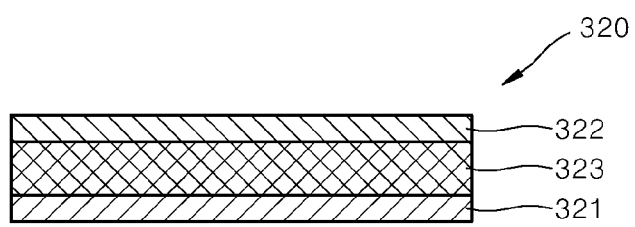
FIG. 10 is a cross-sectional view of an OLED pixel of FIG. 9.

FIG. 10 is a cross-sectional view of the OLED pixel 320 of FIG. 9. Referring to FIG. 10, the OLED pixel 320 includes a first electrode 321 and a second electrode 322 spaced apart from each other, and a white organic emission layer 323 disposed between the first and second electrodes 321 and 322. The first and second electrodes 321 and 322 may be an anode electrode and a cathode electrode, respectively. Alternatively, the first and second electrodes 321 and 322 may be a cathode electrode and an anode electrode, respectively. One of the first and second electrodes 321 and 322 may be a common electrode and the other may be a pixel electrode. In example embodiments, the pixel electrode is connected to a TFT (not shown) capable of selectively driving the OLED pixel 320.

A white organic emission layer 323 that emits white light is placed between the first and second electrodes 321 and 322. The white organic emission layer 323 emits white light when current is supplied between the first and second electrodes 321 and 322, and may have a structure in which a plurality of emission layers (e.g., red, green, and blue emission layers) are stacked. A reflecting plate (not shown) that reflects white light emitted from the white organic emission layer 323 toward the second electrode 322 may be placed on the substrate 310. Although not shown, a hole injection layer and/or a hole transport layer may be further placed between the first electrode 321 (which is an anode electrode) and the white organic emission layer 323, and an electron injection layer and/or an electron transport layer may be further placed between the second electrode 322 (which is a cathode electrode) and the white organic emission layer 323.

Figure 11:
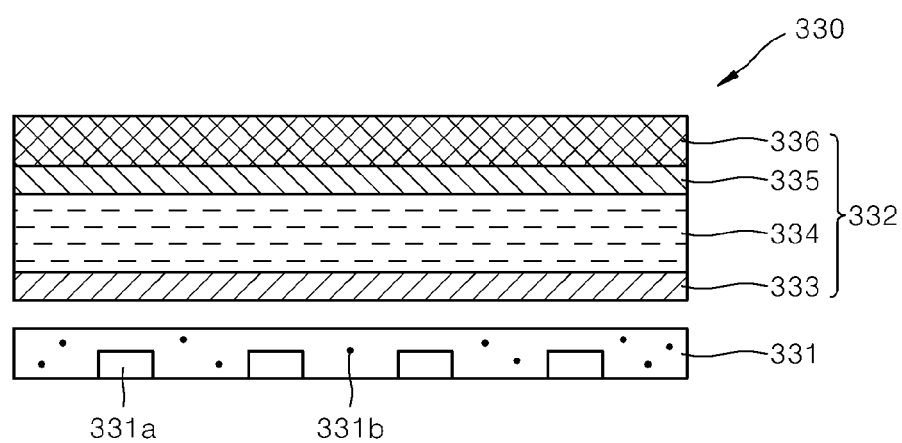
FIG. 11 is a cross-sectional view of an LED pixel of FIG. 9.

FIG. 11 is a cross-sectional view of the LED pixel 330 of FIG. 9. Referring to FIG. 11, the LED pixel 330 includes a white backlight unit 331 that emits white light, and a liquid crystal panel 332 that selectively emits light of a given (or, alternatively predetermined) primary color (red light, green light, or blue light) by using the white light incident thereon from the white backlight unit 331. The white backlight unit 331 includes an LED light source 331a. In detail, the white backlight unit 331 may include a blue LED light source 331a that emits blue light, and red and green quantum dots 331b excited by the blue light emitted from the blue LED light source 331a to emit red light and green light, respectively. When the white backlight unit 331 includes the blue LED light source 331a and the red and green quantum dots 331b as described above, the sensitivity for red may be increased to improve color reproducibility. Otherwise, the white backlight unit 331 may include either red, green, and blue LED light sources 331a, or a UV LED light source 331a and red, green, and blue fluorescent substances (not shown). Otherwise, the white backlight unit 331 may include the blue LED light source 331a and a yellow fluorescent substance (not shown).

White light emitted from the white backlight unit 331 is incident toward the liquid crystal panel 332. The liquid crystal panel 332 may include a first polarizing plate 333, a liquid crystal layer 334, a second polarizing plate 335, and a color filter 336. The liquid crystal layer 334 acts as an optical shutter and allows white light passing through the first polarizing plate 333 to selectively pass therethrough. Electrodes (not shown) are placed on upper and lower surfaces of the liquid crystal layer 334 to drive the liquid crystal layer 334, and one of the electrodes is connected to a TFT (not shown). Thus, white light W may be emitted from the LED pixel 230. The color filter 336 allows light of a given (or, alternatively predetermined) primary color in white light passing through the liquid crystal layer 334 to pas therethrough, and emits the light to the external environment.

For example, when the color filter 336 is a red color filter, only red light in white light passing through the liquid crystal layer 334 passes through the color filter 336 and is then emitted to the external environment. When the color filter 336 is a green color filter, only green light in white light passing through the liquid crystal layer 334 passes through the green light and is then emitted to the external environment. When the color filter 336 is a blue color filter, only blue light in white light passing through the liquid crystal layer 334 passes through the color filter 336 and is then emitted to the external environment.

Figure 12:
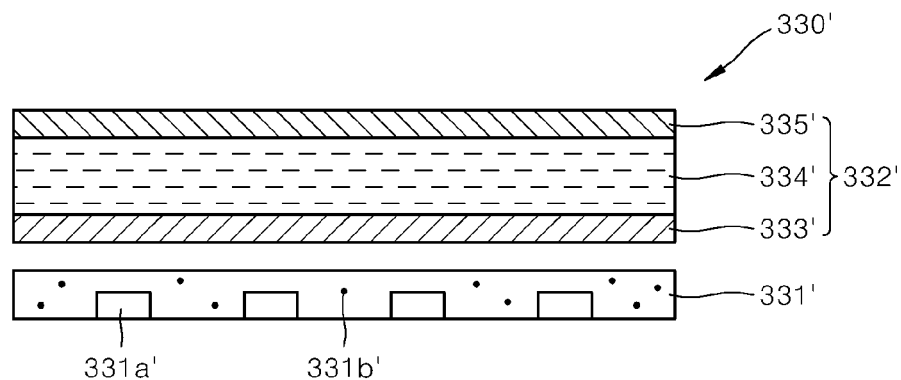
FIG. 12 is a cross-sectional view of a modified example of the LED pixel of FIG. 9.

FIG. 12 is a cross-sectional view of an LED pixel 330' that is a modified example of the LED pixel of FIG. 9. Referring to FIG. 12, the LED pixel 330' includes a backlight unit 331' that emits light of a given (or, alternatively predetermined) primary color (red light, green light, or blue light), and a liquid crystal panel 332' that allows the light of the given (or, alternatively predetermined) primary color incident thereon from the backlight unit 331' to selectively pass therethrough. The backlight unit 331' includes an LED light source 331a'. In detail, the backlight unit 331' may include a red LED light source, a green LED light source, or a blue LED light source. The light of the given (or, alternatively predetermined) primary color back emitted from the light unit 331' is incident toward the liquid crystal panel 332'. The liquid crystal panel 332' may include a first polarizing plate 333', a liquid crystal layer 334', and a second polarizing plate 335'. The liquid crystal layer 334' acts as an optical shutter, and allows the light of the given (or, alternatively predetermined) primary color to selectively pass through the first polarizing plate 333'. Electrodes (not shown) may be placed on upper and lower surfaces of the liquid crystal layer 334' to drive the liquid crystal layer 334; and one of the electrodes is connected to a TFT (not shown).

In the display device 300 according to example embodiments, the OLED pixels 320 that emit white light W are disposed on the substrate 310, and the LED pixels 330 (or 330') that emit red light R, green light G, and blue light B are disposed between the OLED pixels 320. The LED pixels 330 (or 330') form an image, and the OLED pixels 320 brighten an image. Thus, the brightness of the display device 300 may increase. Furthermore, when the white backlight unit 331 of the LED pixel 330 is manufactured using a blue LED light source 331a and red and green quantum dots 331b, color reproducibility for white may be improved. The OLED pixels 320 may be arranged between the LED pixels 330 (or 330') in a regular pattern or a random pattern.

Figure 13:
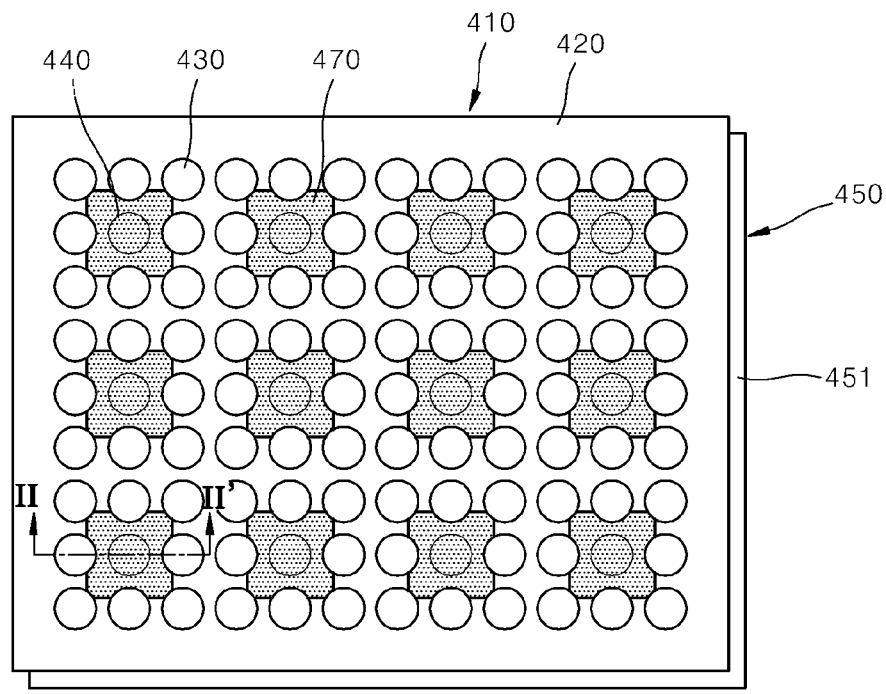
FIG. 13 is a schematic plan view of a display device according to example embodiments.
Figure 14:
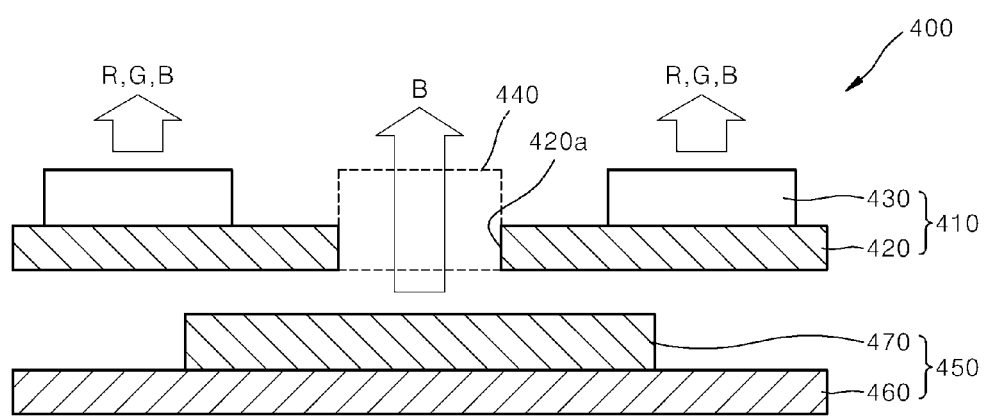
FIG. 14 is a cross-sectional view taken along line II-II' of FIG. 13.

FIG. 13 is a schematic plan view of a display device 400 according to example embodiments. FIG. 14 is a cross-sectional view taken along line II-II' of FIG. 1.

Referring to FIGS. 13 and 14, the display device 400 includes an organic light-emitting display device 410 and an LCD device 450 that are stacked vertically. First and second substrates 420 and 460 are spaced apart from each other. In the display device 400, the first substrate 420 may be disposed ahead of the second substrate 460. A plurality of OLED pixels 430 are placed on the first substrate 420 and a plurality of LED pixels 470 are placed on the second substrate 460. Various types of substrates may be used as the first and second substrates 420 and 460. For example, a flexible substrate (e.g., a plastic substrate) or a hard substrate (e.g., a glass substrate) may be used as the first and second substrates 420 and 460.

The organic light-emitting display device 410 includes a plurality of OLED pixels 430 and a plurality of blank pixels 440 disposed on the first substrate 420. The LCD device 450 includes a plurality of LED pixels 470 disposed on the second substrate 460. The LED pixels 470 each include a backlight unit (see FIGS. 17 and 18) that uses an LED as a light source. The LED pixels 470 may be prepared to correspond to the blank pixels 440.

The OLED pixels 430 are arranged on the first substrate 420 in a given (or, alternatively predetermined) pattern, and the blank pixels 440 are arranged between the OLED pixels 430 in a given (or, alternatively predetermined) pattern. Each of the OLED pixels 430 emits light of a given (or, alternatively predetermined) primary color (i.e., red light, green light, or blue light). For example, when one of the OLED pixels 430 is a red pixel that emits red light, the OLED pixels 430 disposed around the red pixel may be a green pixel that emits green light and a blue pixel that emits blue light. The blank pixels 440 are pixels that allow blue light emitted from the LED pixels 470 to pass therethrough. Thus, the blue light emitted from the LED pixels 470 may pass through the blank pixels 440 and then be emitted to the external environment. The blank pixels 440 may be manufactured by forming through-holes 420a in the first substrate 420. The blank pixels 440 may be arranged between the OLED pixels 430 in a regular pattern or a random pattern.

The LED pixels 470 are arranged on the second substrate 460 in a given (or, alternatively predetermined) pattern. The LED pixels 470 may be prepared on locations corresponding to the blank pixels 440 described above. Thus, the LED pixels 470 may be arranged in the same pattern as the blank pixels 440. The LED pixels 470 emit blue light.

Figure 15:
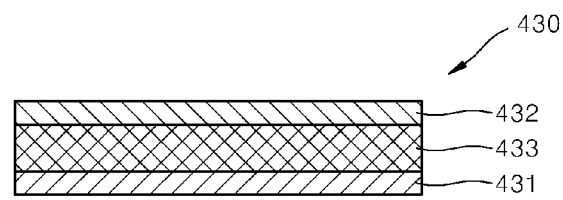
FIG. 15 is a cross-sectional view of an OLED pixel of FIG. 14.

FIG. 15 is a cross-sectional view of the OLED pixel 430 of FIG. 14. Referring to FIG. 15, the OLED pixel 430 includes first and second electrodes 431 and 432 spaced apart from each other, and an organic emission layer 433 disposed between the first and second electrodes 431 and 432. The first and second electrodes 431 and 432 may be an anode electrode and a cathode electrode, respectively. In example embodiments, the first electrode 431 may include, for example, a transparent conductive material (e.g., ITO, IZO, $SnO_2$, or ZnO), but is not limited thereto. The second electrode 432 may include, for example, a metal (e.g., Al, Ag, Mg, Li, or Ca or an alloy thereof), but is not limited thereto. Alternatively, the first and second electrodes 431 and 432 may be a cathode electrode and an anode electrode, respectively. One of the first and second electrodes 431 and 432 may be a common and the other may be a pixel electrode. In example embodiments, the pixel electrode is connected to a TFT (not shown) capable of driving the OLED pixel 430.

An organic emission layer 433 that emits light of a given (or, alternatively predetermined) primary color is placed between the first and second electrodes 431 and 432. The organic emission layer 433 may be, for example, a red emission layer, a green emission layer, or a blue emission layer. When the TFT is driven to cause current to flow between the first and second electrodes 431 and 432, holes flow from the first electrode 431 (which is an anode electrode) into the organic emission layer 433, and electrons flow from the second electrode 432 (which is a cathode electrode) to the organic emission layer 433. Thus, the holes and the electrons are combined in the organic emission layer 433 to emit light of a given (or, alternatively predetermined) color (e.g., red light, green light, or blue light) The emitted light of the given (or, alternatively predetermined) color may be emitted to the external environment via the second electrode 432. A reflecting plate (not shown) may be placed on the substrate 420 to reflect the light of the given (or, alternatively predetermined) color emitted from the organic emission layer 433 toward the second electrode 432. Although not shown, a hole injection layer and/or a hole transport layer may be further placed between the first electrode 431 (which is an anode electrode) and the organic emission layer 433, and an electron injection layer and/or an electron transport layer may be further placed between the second electrode 432 (which is a cathode electrode) and the organic emission layer 433.

Figure 16:
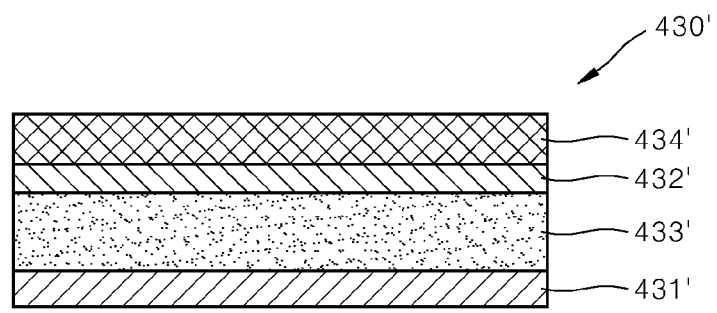
FIG. 16 is a cross-sectional view of a modified example of the OLED pixel of FIG. 14.

FIG. 16 is a cross-sectional view of an OLED pixel 430' that is a modified example of the OLED pixel 430 of FIG. 14. Referring to FIG. 16, the OLED pixel 430' includes first and second electrodes 431' and 432' spaced apart from each other, a white organic emission layer 433' placed between the first and second electrodes 431' and 432', and a color filter 434' placed on the second electrode 432'. The white organic emission layer 433' emits white light when current is supplied between the first and second electrodes 431' and 432', and may have a structure in which a plurality of emission layers (e.g., red, green, and blue emission layers) are stacked. The color filter 434' allows light of a given (or, alternatively predetermined) light (e.g., red light, green light, or blue light) in white light incident thereon from the white organic emission layer 433' to pass therethrough and emits the light to the external environment.

Figure 17:
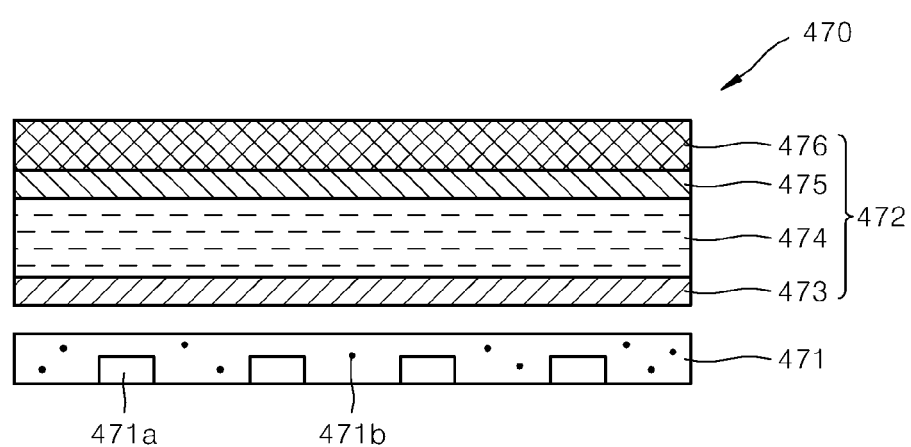
FIG. 17 is a cross-sectional view of an LED pixel of FIG. 14.

FIG. 17 is a cross-sectional view of the LED pixel 470 of FIG. 14. Referring to FIG. 17, the LED pixel 470 includes a white backlight unit 471 that emits white light, and a liquid crystal panel 472 that selectively emits blue light by using the white light incident thereon from the white backlight unit 471. The white backlight unit 471 includes an LED light source 471a. In detail, the white backlight unit 471 may include a blue LED light source 471a that emits blue light, and red and green quantum dots 471b excited by the blue light emitted from the blue LED light source 471a to emit red light and green light, respectively. When the white backlight unit 471 includes the blue LED light source 471a and the red and green quantum dots 471b as described above, the sensitivity for red may be increased to improve color reproducibility. Otherwise, the white backlight unit 471 may include either red, green, and blue LED light sources 471a, or a UV LED light source 471a and red, green, and blue fluorescent substances (not shown). Otherwise, the white backlight unit 471 may include a blue LED light source 471a and a yellow fluorescent substance (not shown).

White light emitted from the white backlight unit 471 is incident toward the liquid crystal panel 472. The liquid crystal panel 472 may include a first polarizing plate 473, a liquid crystal layer 474, a second polarizing plate 475, and a blue color filter 476. The liquid crystal layer 474 acts as an optical shutter and allows white light passing through the first polarizing plate 473 to selectively pass therethrough. Electrodes (not shown) are placed on upper and lower surfaces of the liquid crystal layer 474 to drive the liquid crystal layer 474. One of the electrodes is connected to the TFT. The blue color filter 476 allows only blue light in the white light passing through the liquid crystal layer 134 to pass therethrough and emits the blue light to the external environment. Thus, the blue light may be emitted from the LED pixel 130.

Figure 18:
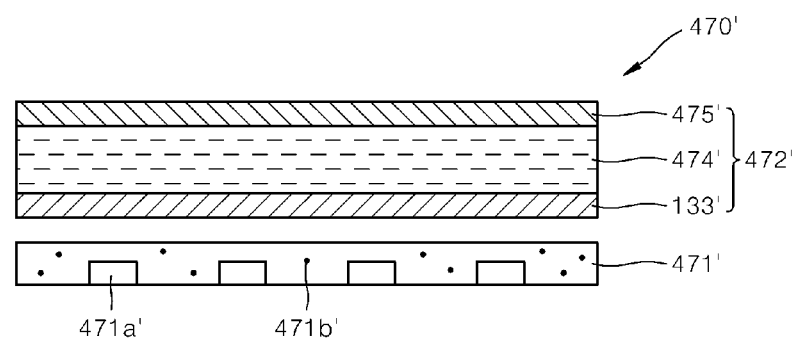
FIG. 18 is a cross-sectional view of a modified example of the LED pixel of FIG. 14.

FIG. 18 is a cross-sectional view of an LED pixel 470' that is a modified example of the LED pixel of FIG. 14. Referring to FIG. 18, the LED pixel 470' includes a blue backlight unit 471' that emits blue light, and a liquid crystal panel 472' that allows the blue light incident thereon from the blue backlight unit 471' to selectively pass therethrough. The blue backlight unit 471' includes a blue LED light source 471a'. The blue light emitted from the blue backlight unit 471' is incident toward the liquid crystal panel 472'. The liquid crystal panel 472' may include a first polarizing plate 473', a liquid crystal layer 474', and a second polarizing plate 475'. The liquid crystal layer 474' acts as an optical shutter and allows blue light passing through the first polarizing plate 473' to selectively pass therethrough. Thus, the blue light may be emitted from the LED pixel 470'.

As described above, the display device 400 according to example embodiments has a structure in which the organic light-emitting display device and the LCD device are stacked vertically. In detail, the OLED pixels 430 and the blank pixels 440 are disposed on the first substrate 420, and the LED pixels 470 (or 470') are arranged to correspond to the blank pixels 440 on the second substrate 460. The OLED pixels 430 emit red light R, green light G, and blue light B, and the LED pixels 470 (or 470') emit blue light B. The blue light emitted from the LED pixels 470 (or 470') passes through the blank pixels 440 in the first substrate 420 and is then emitted to the external environment. An organic light-emitting display device has slightly lower color reproducibility for blue and the lifespan of the blue pixel thus more easily decreases. According to example embodiments, the problem of the organic light-emitting display device with respect to the blue pixel may be compensated for using the LED pixels 470 (or 470') that emit blue light. That is, in the display device 400 according to example embodiments, the OLED pixels 430 that emit red light R, green light G, and blue light B and the blank pixels 440 that allow the blue light B to pass therethrough are disposed the first substrate 420, and the LED pixels 470 that emit blue light B are arranged to correspond to the blank pixels 440 on the second substrate 460. The blue light B emitted from the LED pixels 470 is emitted to the external environment via the blank pixels 440. The OLED pixels 430 form an image, and the LED pixels 470 (or 470') that emit the blue light B passing through the blank pixels 440 may compensate for or be replaced with the OLED pixels 430 that emit blue light. Thus, color reproducibility for blue of the image may be improved and an image that approximates a real image may be formed. Also, the lifespan of the display device 400 may increase. Furthermore, when the white backlight unit 471 of the LED pixel 470 is manufactured using a blue LED light source 471a and red and green quantum dots 471b, the color reproducibility may be improved.

Figure 19:
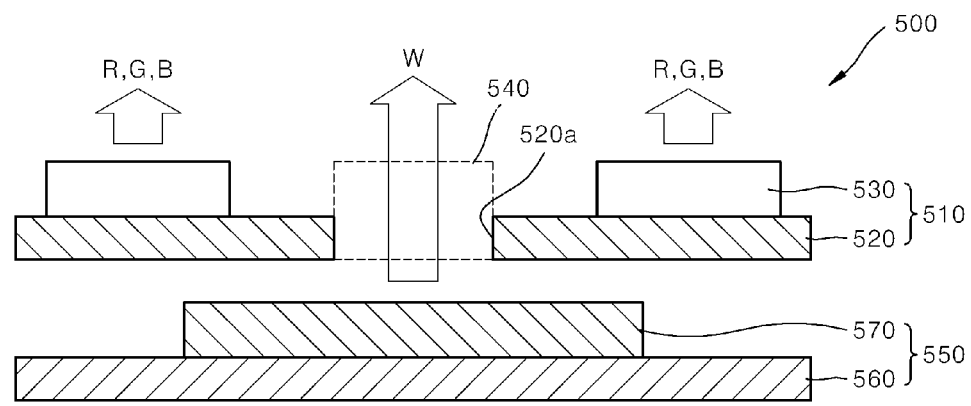
FIG. 19 is a schematic plan view of a display device according to example embodiments.

FIG. 19 is a schematic plan view of a display device 500 according to example embodiments. A plan view of the display device 500 illustrated in FIG. 19 is the same as that of the display device 400 illustrated in FIG. 13. The display device 500 will now be described focusing on the differences from the display devices 100 to 400 according to the previous example embodiments.

Referring to FIG. 19, a first substrate 520 and a second substrate 560 are prepared to be spaced apart from and facing each other. In the display device 500, the first substrate 520 may be disposed ahead of the second substrate 560. A plurality of OLED pixels 530 are placed on the first substrate 520, and a plurality of LED pixels 570 are placed on the second substrate 560. An organic light-emitting display device 510 includes the plurality of OLED pixels 530 and a plurality of blank pixels 540 disposed on the first substrate 520. An LCD device 550 includes the plurality of LED pixels 570 disposed on the second substrate 560. The LED pixels 570 each include a backlight unit (see FIG. 20) that uses an LED as a light source. The LED pixels 570 may be prepared to correspond to the blank pixels 540.

The OLED pixels 530 are arranged on the first substrate 520 in a given (or, alternatively predetermined) pattern and the blank pixels 540 are arranged between the OLED pixels 530 in a given (or, alternatively predetermined) pattern. The OLED pixels 530 each emit light of a given (or, alternatively predetermined) primary color (i.e., red light, green light, or blue light). For example, when one of the OLED pixels 530 is a red pixel that emits red light, OLED pixels 530 disposed around the red pixel may be a green pixel that emits green light and a blue pixel that emits blue light. The OLED pixels 530 are the same as the OLED pixel 430 of FIG. 15 or the OLED pixel 430' of FIG. 16 described above and are thus not redundantly described here. The blank pixels 540 are pixels that allow white light emitted from the LED pixels 570 (which will be described below) to pass therethrough. Thus, the white light emitted from the LED pixels 570 may pass through the blank pixels 540 and then be emitted to the external environment. The blank pixels 540 may be prepared by forming through-holes 520a in the first substrate 520. The blank pixels 540 may be arranged between the OLED pixels 530 in a regular pattern or a random pattern. The LED pixels 570 may be placed on locations on the second substrate 560 that correspond to the blank pixels 540. Accordingly, the LED pixels 570 may be arranged in the same pattern as the blank pixels 540. The LED pixels 570 emit white light.

Figure 20:
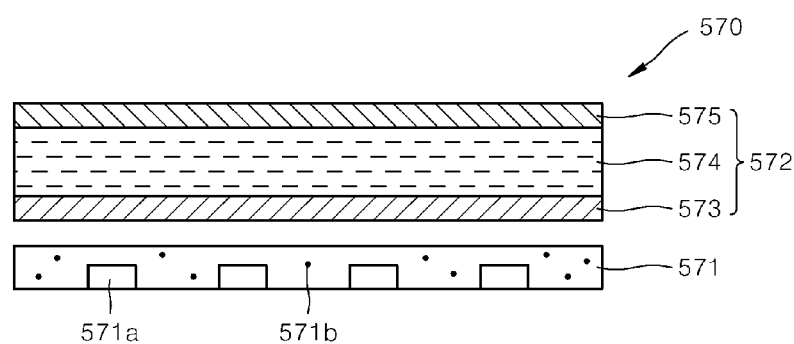
FIG. 20 is a cross-sectional view of an LED pixel of FIG. 19.

FIG. 20 is a cross-sectional view of the LED pixel 570 of FIG. 19. Referring to FIG. 20, the LED pixel 570 includes a white backlight unit 571 that emits white light, and a liquid crystal panel 572 that allows the white light incident thereon from the white backlight unit 571 to selectively pass therethrough. The white backlight unit 571 includes an LED light source 571a. In detail, the white backlight unit 571 may include a blue LED light source 571a that emits blue light, and red and green quantum dots 571b excited by the blue light emitted from the blue LED light source 571a to emit red light and green light, respectively. When the white backlight unit 571 includes the blue LED light source 571a and the red and green quantum dots 571b as described above, the sensitivity for a red color may be increased to improve color reproducibility. Otherwise, the white backlight unit 571 may include either red, green, and blue LED light sources 571a or a UV LED light source 571a and red, green, and blue fluorescent substances (not shown). Otherwise, the white backlight unit 571 may include the blue LED light source 571a and a yellow fluorescent substance (not shown).

White light emitted from the white backlight unit 571 is incident toward the liquid crystal panel 572. The liquid crystal panel 572 may include a first polarizing plate 573, a liquid crystal layer 574, and a second polarizing plate 575. The liquid crystal layer 574 acts as an optical shutter and allows white light incident thereon to selectively pass therethrough. Electrodes (not shown) are placed on upper and lower surfaces of the liquid crystal layer 574 to drive the liquid crystal layer 574. One of the electrodes is connected to a TFT (not shown). Thus, the white light may be emitted from the LED pixel 570.

According to example embodiments, relatively low brightness and lifespan of an organic light-emitting display device may be compensated for using the LED pixels 570 that emits white light. That is, in the display device 500 according to example embodiments, the OLED pixels 530 that emit red light R, green light G, and blue light B and the blank pixels 540 that allow white light W to pass therethrough are disposed on the first substrate 520, and the LED pixels 570 corresponding to the blank pixels 540 are disposed on the second substrate 560. The white light emitted from the LED pixels 570 may be emitted to the external environment via the blank pixels 540. The OLED pixels 530 form an image, and the LED pixels 570 that emit the white light W passing through the blank pixels 540 brighten the image. Thus, the brightness and lifespan of the display device 500 may increase. Furthermore, when the backlight units 571 of the LED pixels 570 are manufactured using a blue LED light source 571a and red and green quantum dots 571b, color reproducibility for a white color may be improved.

Figure 21:
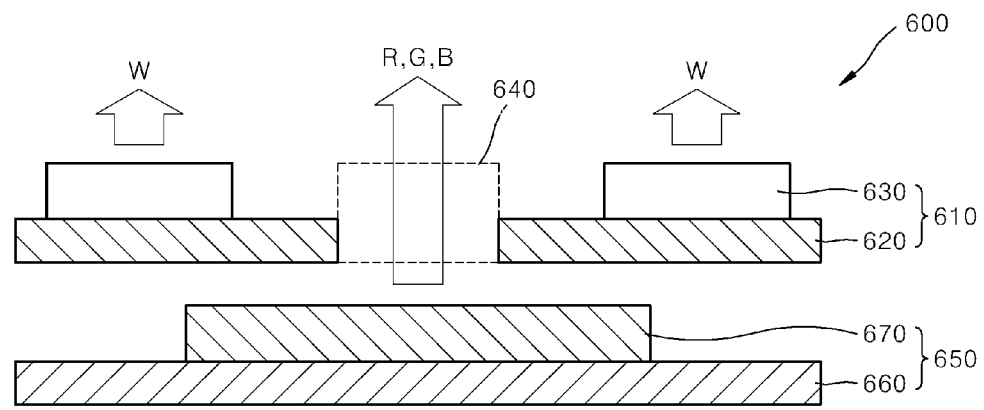
FIG. 21 is a schematic plan view of a display device according to example embodiments.

FIG. 21 is a schematic plan view of a display device 600 according to example embodiments. A plan view of the display device 600 is the same as that of the display device 400 of FIG. 13. The display device 600 will now be described focusing on the differences from the display devices 100 to 500 according to the previous embodiments.

Referring to FIG. 21, first and second substrates 620 and 660 are spaced apart from each other and face each other. In the display device 600, the first substrate 620 may be disposed ahead of the second substrate 660. A plurality of OLED pixels 630 are placed on the first substrate 620 and a plurality of LED pixels 670 are placed on the second substrate 660. An organic light-emitting display device 610 includes the plurality of OLED pixels 630 and a plurality of blank pixels 640 disposed on the first substrate 620. An LCD device 650 includes a plurality of LED pixels 670 disposed on the second substrate 660. The LED pixels 670 include a backlight unit (see FIGS. 23 and 24) that uses an LED as a light source. The LED pixels 670 may be disposed to correspond to the blank pixels 640.

The OLED pixels 630 are disposed on the first substrate 620, and the blank pixels 640 are disposed between the OLED pixels 630. The OLED pixels 630 emit white light, and the blank pixels 640 allows light of a given (or, alternatively predetermined) primary color (red light, green light, or blue light) emitted from LED pixels 670 (which will be described below) to pass therethrough. The LED pixels 670 are arranged on the second substrate 660 to correspond to the blank pixels 640. The LED pixels 670 emit red light R, green light G, and blue light B. Each of the LED pixels 670 emits light of a given (or, alternatively predetermined) primary color (i.e., red light, green light, or blue light). For example, when one of the LED pixels 670 is a red pixel that emits red light, LED pixels 670 disposed around the red pixel may be a green pixel that emits green light and a blue pixel that emits blue light.

Figure 22:
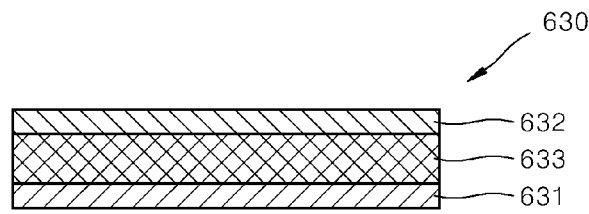
FIG. 22 is a cross-sectional view of an OLED pixel of FIG. 21.

FIG. 22 is a cross-sectional view of the OLED pixel 630 of FIG. 21. Referring to FIG. 22, the OLED pixel 630 includes a first electrode 631 and a second electrode 632 that are spaced apart from each other, and a white organic emission layer 633 disposed between the first and second electrodes 631 and 632. The first and second electrodes 631 and 632 may be an anode electrode and a cathode electrode, respectively. Alternatively, the first and second electrodes 631 and 632 may be a cathode electrode and an anode electrode, respectively. One of the first and second electrodes 631 and 632 may be a common electrode and the other may be an electrode, respectively. In example embodiments, the pixel electrode is connected to a TFT (not shown) capable of selectively driving the OLED pixel 630.

A white organic emission layer 633 that emits white light is placed between the first and second electrodes 631 and 632. The white organic emission layer 633 emits white light when current is supplied between the first and second electrodes 631 and 632, and may have a structure in which a plurality of emission layers (e.g., red, green, and blue emission layers) are stacked. A reflecting plate (not shown) may be placed on the first substrate 620 to reflect the white light emitted from the white organic emission layer 633 toward the second electrode 632. Although not shown, a hole injection layer and/or a hole transport layer may be further placed between the first electrode 631 (which is an anode electrode) and the white organic emission layer 633, and an electron injection layer and/or an electron transport layer may be further placed between the second electrode 632 (which is a cathode electrode) and the white organic emission layer 633.

Figure 23:
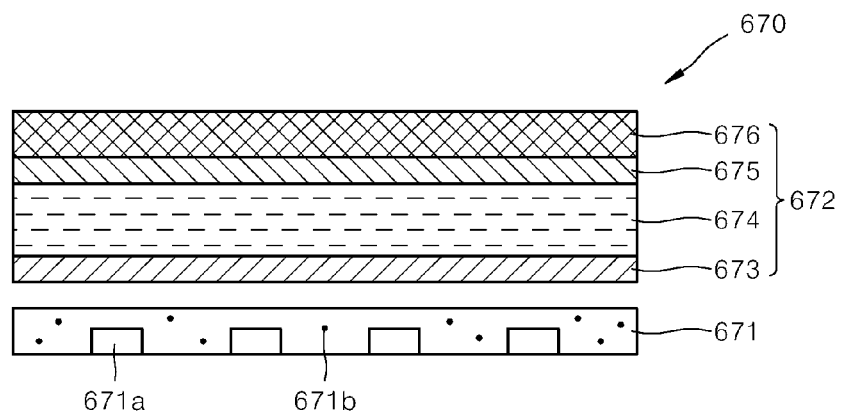
FIG. 23 is a cross-sectional view of an LED pixel of FIG. 21.

FIG. 23 is a cross-sectional view of the LED pixel 670 of FIG. 21. Referring to FIG. 23, the LED pixel 670 includes a white backlight unit 671 that emits white light, and a liquid crystal panel 672 that emits light of a given (or, alternatively predetermined) primary color (e.g., red light, green light, or blue light) by using white light incident thereon from the white backlight unit 671. The white backlight unit 671 includes an LED light source 671a. In detail, the white backlight unit 671 may include a blue LED light source 671a that emits blue light, and red and green quantum dots 671b excited by the blue light emitted from the blue LED light source 671a to emit red light and green light, respectively. When the white backlight unit 671 includes the blue LED light source 671a and the red and green quantum dots 671b as described above, the sensitivity for red may be increased to improve color reproducibility. Otherwise, the white backlight unit 671 may include either red, green, and blue LED light sources 671a, or a UV LED light source 671a and red, green, and blue fluorescent substances (not shown). Otherwise, the white backlight unit 671 may include the blue LED light source 671a and a yellow fluorescent substance (not shown).

White light emitted from the white backlight unit 671 is incident toward the liquid crystal panel 672. The liquid crystal panel 672 may include a first polarizing plate 673, a liquid crystal layer 674, a second polarizing plate 675, and a color filter 676. The liquid crystal layer 674 acts as an optical shutter and allows white light passing through the first polarizing plate 673 to selectively pass therethrough. Electrodes (not shown) are placed on upper and lower surfaces of the liquid crystal layer 674 to drive the liquid crystal layer 674, and one of the electrodes is connected to the TFT. The color filter 676 allows light of a given (or, alternatively predetermined) primary color in white light passing through the liquid crystal layer 674 to pas therethrough and emits the light to the external environment. For example, when the color filter 676 is a red color filter, only red light in white light passing through the liquid crystal layer 674 passes through the color filter 676 and is then emitted to the external environment. When the color filter 676 is a green color filter, only green light in white light passing through the liquid crystal layer 674 passes through the green light and is then emitted to the external environment. When the color filter 676 is a blue color filter, only blue light in white light passing through the liquid crystal layer 674 passes through the color filter 676 and is then emitted to the external environment.

Figure 24:
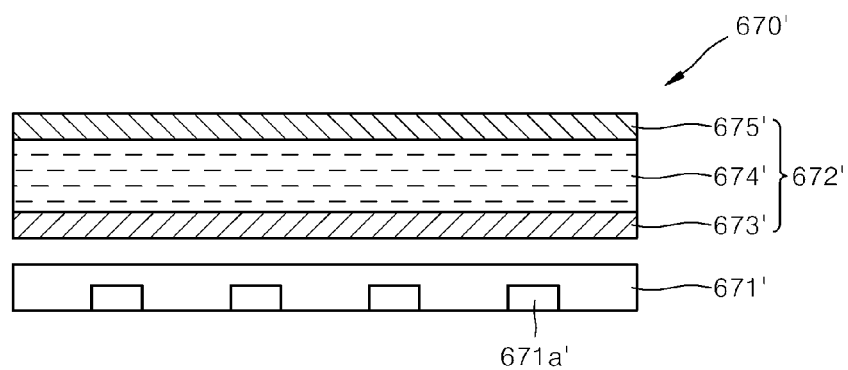
FIG. 24 is a cross-sectional view of a modified example of the LED pixel of FIG. 21.

FIG. 24 is a cross-sectional view of an LED pixel 670' that is a modified example of the LED pixel 670 of FIG. 21. Referring to FIG. 24, the LED pixel 670' includes a backlight unit 671' that emits light of a given (or, alternatively predetermined) primary color light (e.g., red light, green light, or blue light), and a liquid crystal panel 672' that allows the light of the given (or, alternatively predetermined) primary color incident thereon from the backlight unit 671' to selectively pass therethrough. The backlight unit 671' includes an LED light source 671a'. In detail, the backlight unit 671' may include a red LED light source, a green LED light source, or a blue LED light source. The given (or, alternatively predetermined) primary color emitted from the backlight unit 671' is incident toward the liquid crystal panel 672'. The liquid crystal panel 672' may include a first polarizing plate 673', a liquid crystal layer 674', and a second polarizing plate 675'. The liquid crystal layer 674' acts as an optical shutter and allows the given (or, alternatively predetermined) primary color passing through the first polarizing plate 673' to selectively pass therethrough. Electrodes (not shown) are disposed on upper and lower surfaces of the liquid crystal layer 674' to drive the liquid crystal layer 674', and one of the electrodes is connected to the TFT.

In the display device 600 according to example embodiments, the OLED pixels 630 that emit white light W and the blank pixels 640 that allow the light of the given (or, alternatively predetermined) primary color to pass therethrough are disposed on the first substrate 620, and the LED pixels 670 (or 670') that emit red light R, green light G, and blue light B are disposed on the second substrate 660 to correspond to the blank pixels 640. The light of the given (or, alternatively predetermined) primary color emitted from the LED pixels 670 (or 670') passes through the blank pixels 640 and is then emitted to the external environment. The LED pixels 670 and 670' form an image, and the OLED pixels 630 brighten the image. Thus, the brightness of the display device 600 may be increased. Furthermore, when the white backlight unit 671 of the LED pixel 670 is manufactured using a blue LED light source 671a and red and green quantum dots 671b, color reproducibility for a white color may be improved. The OLED pixels 670 and 670' may be arranged in a regular pattern or a random pattern.

Figure 25:
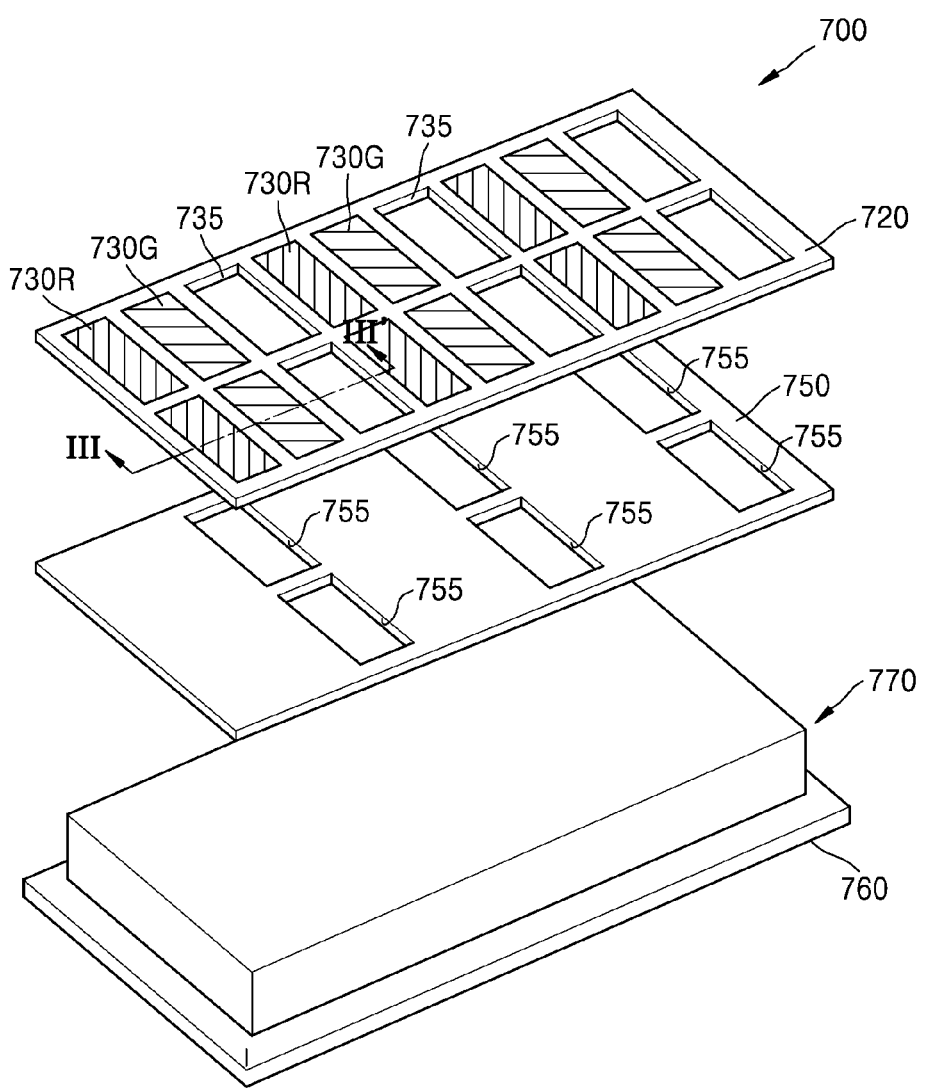
FIG. 25 is an exploded perspective view of a display device according to example embodiments.
Figure 26:
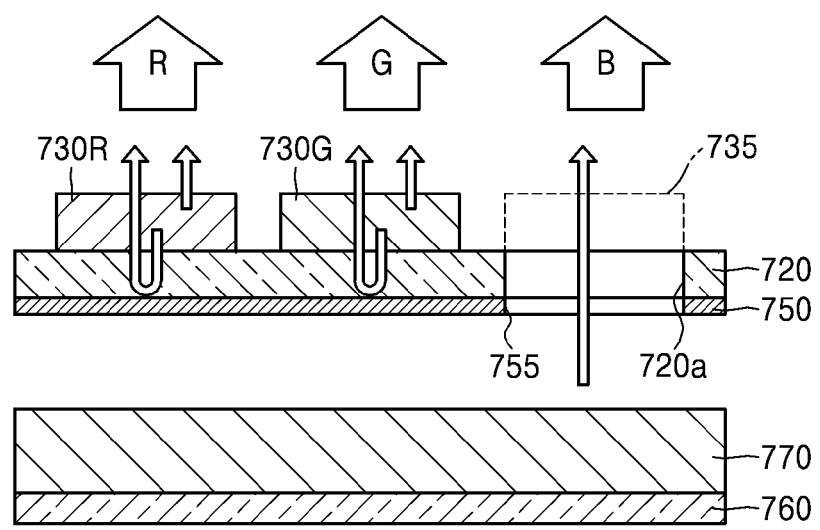
FIG. 26 is a cross-sectional view taken along line III-III' of FIG. 25.

FIG. 25 is an exploded perspective view of a display device 700 according to example embodiments. FIG. 26 is a cross-sectional view taken along line III-III' of FIG. 25.

Referring to FIGS. 25 and 26, the display device 700 includes a first substrate 720, a second substrate 760, a plurality of red OLED pixels 730R, a plurality of green OLED pixels 730G, and a plurality of blank pixels 735 disposed on the first substrate 720, a reflecting plate 750 having first through-holes 755 disposed between the first substrate 720 and second substrate 760, and a blue light emission unit 770 disposed on the second substrate 760. The first and second substrates 720 and 760 are spaced apart from each other. In the display device 700, the first substrate 720 may be disposed ahead of the second substrate 760. Various types of substrates may be used as the first and second substrates 720 and 760. For example, a flexible substrate (e.g., a plastic substrate) or a hard substrate (e.g., a glass substrate) may be used as the first and second substrates 720 and 760.

The red OLED pixels 730R, the green OLED pixels 730G, and the blank pixels 735 are disposed on the first substrate 720. The red OLED pixels 730R, the green OLED pixels 730G, and the blank pixels 735 are sequentially disposed. The red and green OLED pixels 730R and 730G emit red and green light, respectively. The blank pixels 735 allow blue light emitted from the blue light emission unit 770 to pass therethrough. To this end, the blank pixels 735 may include second through-holes 720a formed in the first substrate 720.

Figure 27A:
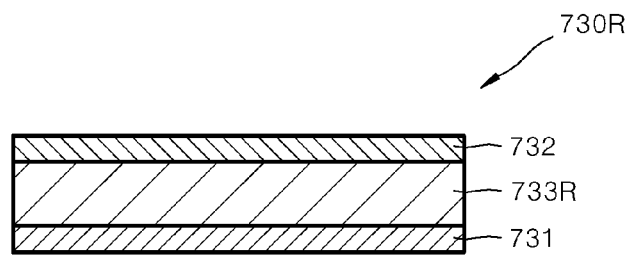
FIGS. 27A and 27B illustrate cross-sections of red and green OLED pixels of FIG. 25.
Figure 27B:
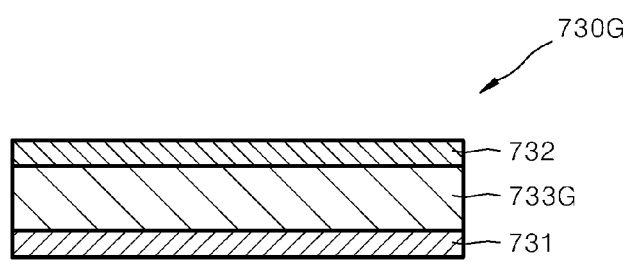

FIGS. 27A and 27B illustrate cross-sections of the red and green OLED pixels 730R and 730G of FIG. 25. Referring to FIGS. 27A and 27B, the red OLED pixel 730R includes the first and second electrodes 731 and 732, and a red organic emission layer 733R that is disposed between the first and second electrodes 731 and 732 and emits red light. The green OLED pixel 730G includes the first and second electrodes 731 and 732, and a green organic emission layer 733G that is disposed between the first and second electrodes 731 and 732 and emits green light.

The first and second electrodes 731 and 732 may be an anode electrode and a cathode electrode, respectively. In example embodiments, the first electrode 731 may include, for example, a transparent conductive material (e.g., ITO, IZO, $SnO_2$, or ZnO) but is not limited thereto. The second electrode 732 may include, for example, a metal (e.g., Al, Ag, Mg, Li, or Ca or an alloy thereof) but is not limited thereto. Alternatively, the first and second electrodes 731 and 732 may be a cathode electrode and an anode electrode, respectively. One of the first and second electrodes 731 and 732 may be a common electrode and the other may be a pixel electrode. In example embodiments, the pixel electrode is connected to a TFT (not shown) capable of driving the OLED pixels 730R and 730G.

When the TFT is driven to cause current to flow between the first and second electrodes 731 and 732, holes flow from the first electrode 731 (which is an anode electrode) to the organic emission layers 733R and 733G and electrons flow from the second electrode 732 (which is a cathode electrode) to the organic emission layers 733R and 733G. Thus, the holes and the electrons are combined in the organic emission layers 733R and 733G to emit light of a given (or, alternatively predetermined) color (e.g., red light or green light). The emitted light of the given (or, alternatively predetermined) color may be emitted to the external environment via the second electrode 732. Although not shown, a hole injection layer and/or a hole transport layer may be further placed between the first electrode 731 (which is an anode electrode) and the organic emission layers 733R and 733G, and an electron injection layer and/or an electron transport layer may be further placed between the second electrode 732 (which is a cathode electrode) and the organic emission layers 733R and 733G.

Referring back to FIGS. 25 and 26, a reflecting plate 750 is disposed below the first substrate 720. The reflecting plate 750 reflects the red light and the green light emitted from the red and green OLED pixels 730R and 730G toward the second electrode 732. First through-holes 755 corresponding to the blank pixels 735 are formed in the reflecting plate 750.

Figure 28:
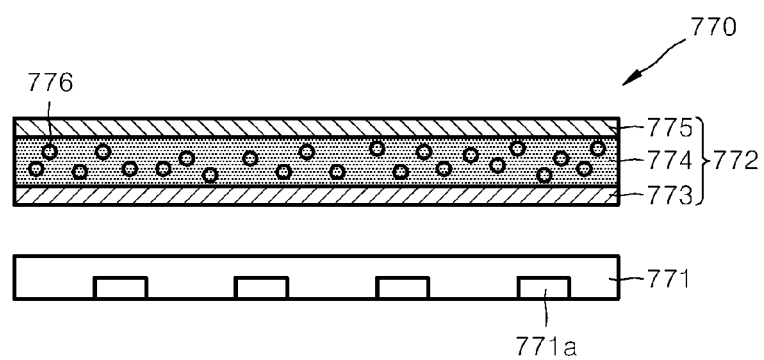
FIG. 28 illustrates a cross-section of a blue light emission unit of FIG. 25.

The blue light emission unit 770 that emits blue light is disposed on the second substrate 760. FIG. 28 illustrates a cross-section of the blue light emission unit of FIG. 25. Referring to FIG. 28, the blue light emission unit 770 includes a blue backlight unit 771 that emits blue light, and a liquid crystal panel 772 that allows the blue light incident thereon from the blue backlight unit 771 to pass therethrough. The backlight unit 771 may include at least one blue LED light source 771a. The blue light emitted from the backlight unit 771 is incident toward the liquid crystal panel 772. The liquid crystal panel 772 may include a first polarizing plate 773, a liquid crystal layer 774, and a second polarizing plate 775. The liquid crystal layer 774 acts as an optical shutter and allows the blue light passing through the first polarizing plate 773 to selectively pass therethrough. In detail, the liquid crystal layer 774 allows the blue light to selectively pass therethrough when liquid crystals 776 in the liquid crystal layer 774 corresponding to the blank pixels 735 are driven. Then the blue light is emitted from the blank pixels 735 via the first and second through-holes 775 and 720a. Electrons (not shown) are placed on upper and lower surfaces of the liquid crystal layer 774 to drive the liquid crystal layer 774.

Referring to FIG. 26, in the structure described above, red lights generated by the red OLED pixel 730R are emitted upward and downward, and the red light emitted downward is reflected by the reflecting plate 750 to move upward. Green lights generated by the green OLED pixel 730G are emitted upward and downward and the green light emitted downward is reflected by the reflecting plate 750 to move upward. Blue light emitted from the blue light emission unit 770 passes through the first through-holes 755 of the reflecting plate 750 and the second through-holes 720a of the first substrate 720 and then moves upward above the blank pixel 735. The intensities of the red and green lights generated by the OLED pixels 730R and 730G may be controlled according to the amount of current flowing between the first and second electrodes 731 and 732. The intensity of the blue light generated by the blue light emission unit 770 and passing through the blank pixel 735 may be controlled by driving the liquid crystals 776 in the liquid crystal layer 774 corresponding to the blank pixel 735.

As described above, in the display device 700 according to example embodiments, relatively low color reproducibility and lifespan of a blue organic emission layer may be compensated for using a blue LED light source 771a and liquid crystals 776. Thus, color reproducibility for blue may be improved, and thus an image that approximates a real image may be formed and the lifespan of the display device 700 may increase.

As described above, in display devices according to example embodiments, a plurality of OLED pixels and a plurality of LED pixels are disposed on the same plane or different planes. When the OLED pixels emit red light, green light, and blue light and the LED pixels emit blue light, color reproducibility for blue may be improved and thus an image that approximates a real image may be formed and the lifespan of the display device may increase. Also, when the OLED pixels emit red light, green light, and blue light and the LED pixels emit white light, the LED pixels may improve the brightness of an image formed by the OLED pixels, and the lifespan of the display device may increase. Also, when the OLED pixels emit white light and the LED pixels emit red light, green light, and blue light, the OLED pixels may improve the brightness of an image formed by the LED pixels. When a white backlight unit of the LED pixel is formed using a blue LED light source and red and green quantum dots, color reproducibility may be improved. Because relatively low color reproducibility and lifespan of a blue organic emission layer may be solved using a blue LED light source and liquid crystal, an image that approximates a real image may be formed and the lifespan of the display device may increase.

It should be understood that example embodiments described therein should be considered in a descriptive sense only and not for purposes of limitation. Descriptions of features or aspects within each embodiment should typically be considered as available for other similar features or aspects in other embodiments.

While example embodiments have been described with reference to the figures, it will be understood by those of ordinary skill in the art that various changes in form and details may be made therein without departing from the spirit and scope of the following claims.

What is claimed is:

1. A display device comprising:
   a plurality of organic light-emitting diode (OLED) pixels on a substrate; and
   a plurality of light-emitting diode (LED) pixels between the plurality of OLED pixels on the substrate, the plurality of LED pixels on a same plane as the plurality of OLED pixels, the plurality of OLED pixels comprise:
   a first electrode and a second electrode spaced apart from each other;
   a white organic emission layer between the first and second electrodes, the white organic emission layer configured to emit white light; and
   a color filter on the second electrode, the color filter configured to allow light of the primary color to pass therethrough.

2. The display device of claim 1, wherein
   the plurality of OLED pixels are configured to emit light of a primary color, and
   the plurality of LED pixels are configured to emit blue light.

3. The display device of claim 2, wherein the plurality of OLED pixels comprise:
   a first electrode and a second electrode spaced apart from each other; and
   an organic emission layer between the first and second electrodes, the organic emission layer configured to emit light of the primary color.

4. The display device of claim 2, wherein the white backlight unit comprises:
   a blue LED light source; and
   red and green quantum dots excited by the blue light emitted from the blue LED light source to emit red light and green light, respectively.

5. The display device of claim 2, wherein the plurality of LED pixels comprise:
   a blue backlight unit configured to emit blue light; and
   a liquid crystal panel including a liquid crystal layer configured to allow the blue light incident thereon from the blue backlight unit to pass therethrough.

6. The display device of claim 1, wherein
   the plurality of OLED pixels are configured to emit light of a primary color, and
   the plurality of LED pixels are configured to emit white light.

7. The display device of claim 6, wherein the plurality of LED pixels comprise:
   a white backlight unit configured to emit white light; and
   a liquid crystal panel including a liquid crystal layer configured to allow the white light incident thereon from the white backlight unit to pass therethrough.

8. The display device of claim 1, wherein
   the plurality of OLED pixels are configured to emit white light, and
   the plurality of LED pixels are configured to emit light of a primary color.

9. The display device of claim 8, wherein the plurality of OLED pixels comprise:
   a first electrode and a second electrode spaced apart from each other; and
   a white organic emission layer between the first and second electrodes, the white organic emission layer configured to emit white light.

10. The display device of claim 8, wherein the plurality of LED pixels comprise:
a white backlight unit configured to emit white light; and
a liquid crystal panel including,
a liquid crystal layer configured to allow the white light incident thereon from the white backlight unit to pass therethrough, and
a color filter configured to transform the white light passing through the liquid crystal layer into the light of the primary color.

11. The display device of claim 8, wherein the plurality of LED pixels comprise:
a backlight unit configured to emit the light of the primary color; and
a liquid crystal layer configured to allow the light of the primary color incident thereon from the backlight unit to pass therethrough.

12. The display device of claim 2, wherein the plurality of LED pixels comprise:
a white backlight unit configured to emit white light; and
a liquid crystal panel including,
a liquid crystal layer configured to allow the white light incident thereon from the white backlight unit to pass therethrough; and
a blue color filter configured to transform the white light passing through the liquid crystal layer into blue light.

13. A display device comprising:
a first substrate and a second substrate spaced apart from and facing each other;
a plurality of organic light-emitting diode (OLED) pixels on the first substrate;
a plurality of light-emitting diode (LED) pixels on the second substrate; and
a plurality of blank pixels on the first substrate corresponding with the plurality of LED pixels on the second substrate, the plurality of blank pixels configured to allow light to pass therethrough.

14. The display device of claim 13, wherein light emitted from the plurality of LED pixels is emitted via the plurality of blank pixels.

15. The display device of claim 14, wherein the plurality of blank pixels comprise through-holes in the first substrate.

16. The display device of claim 14, wherein
the plurality of OLED pixels are configured to emit light of a primary color, and
the plurality of LED pixels are configured to emit blue light.

17. The display device of claim 16, wherein the plurality of OLED pixels comprise:
a first electrode and a second electrode spaced apart from each other; and
an organic emission layer between the first and second electrodes, the organic emission layer configured to emit the light of the primary color.

18. The display device of claim 16, wherein the plurality of OLED pixels comprise:
a first electrode and a second electrode spaced apart from each other;
a white organic emission layer between the first and second electrodes, the white organic emission layer configured to emit white light; and
a color filter on the second electrode, the color filter configured to allow the light of the primary color to pass therethrough.

19. The display device of claim 16, wherein the plurality of LED pixels comprise:

a white backlight unit configured to emit white light; and
a liquid crystal panel including,
a liquid crystal layer configured to allow the white light incident thereon from the white backlight unit to pass therethrough, and
a blue color filter configured to transform the white light passing through the liquid crystal layer into blue light.

20. The display device of claim 19, wherein the white backlight unit comprises:
a blue LED light source; and
red and green quantum dots excited by the blue light emitted from the blue LED light source to emit red light and green light, respectively.

21. The display device of claim 16, wherein the plurality of LED pixels comprise:
a blue backlight unit configured to emit blue light; and
a liquid crystal panel including a liquid crystal layer configured to allow the blue light incident thereon from the blue backlight unit to pass therethrough.

22. The display device of claim 14, wherein
the plurality of OLED pixels are configured to emit a primary color, and
the plurality of LED pixels are configured to emit white light.

23. The display device of claim 22, wherein the plurality of LED pixels comprise:
a white backlight unit configured to emit white light; and
a liquid crystal panel including a liquid crystal layer configured to allow the white light incident thereon from the white backlight unit to pass therethrough.

24. The display device of claim 14, wherein
the plurality of OLED pixels are configured to emit white light, and
the plurality of LED pixels are configured to emit light of a primary color.

25. The display device of claim 24, wherein the plurality of OLED pixels comprise:
a first electrode and a second electrode spaced apart from each other; and
a white organic emission layer between the first and second electrodes, the white organic emission layer configured to emit white light.

26. The display device of claim 24, wherein the plurality of LED pixels comprise:
a white backlight unit configured to emit white light; and
a liquid crystal panel including,
a liquid crystal layer configured to allow the white light incident thereon from the white backlight unit to pass therethrough, and
a color filter configured to transform the white light passing through the liquid crystal layer into the light of the primary color.

27. The display device of claim 24, wherein the plurality of LED pixels comprise:
a backlight unit configured to emit the light of the primary color; and
a liquid crystal panel including a liquid crystal layer configured to allow the light of the primary color incident thereon from the backlight unit to pass therethrough.

28. A display device comprising:
a first substrate and a second substrate spaced apart from and facing each other;

a plurality of red and green organic light-emitting diode (OLED) pixels on the first substrate, the plurality of red and green OLED pixels configured to emit red light and green light, respectively;

a plurality of blank pixels on the first substrate, the plurality of blank pixels configured to allow blue light to pass therethrough;

a reflecting plate between the first and second substrates, the reflecting plate including first through-holes corresponding to the plurality of blank pixels; and a blue light emission unit on the second substrate, the blue light emission unit configured to emit blue light.

29. The display device of claim 28, wherein the plurality of blank pixels comprise second through-holes in the first substrate.

30. The display device of claim 29, wherein the blue light emission unit comprises:

a blue backlight unit including at least one blue LED light source configured to emit blue light; and a liquid crystal panel including a liquid crystal layer configured to allow the blue light emitted from the blue backlight unit to pass therethrough.

31. The display device of claim 30, wherein the liquid crystal layer is configured to allow the blue light emitted from the blue backlight unit to selectively pass therethrough when liquid crystals corresponding to the plurality of blank pixels are driven.

32. The display device of claim 28, wherein each of the red and green OLED pixels comprises:

a first electrode and a second electrode spaced apart from each other; and an organic emission layer between the first and second electrodes, the organic emission layer configured to emit red light if the OLED pixel is a red OLED pixel and configured to emit green light if the OLED pixel is a green OLED pixel.

33. A display device comprising:

a plurality of organic light-emitting diode (OLED) pixels on a substrate, the plurality of OLED pixels including, a first electrode and a second electrode spaced apart from each other, a white organic emission layer between the first and second electrodes, the white organic emission layer configured to emit white light, and a color filter directly on the second electrode, the color filter configured to allow light of a primary color to pass therethrough; and a plurality of light-emitting diode (LED) pixels between the plurality of OLED pixels, the plurality of LED pixels including, a backlight unit including a blue LED light source, and a liquid crystal panel including, a liquid crystal layer configured to allow the light incident thereon from the backlight unit to pass therethrough.

34. The display device of claim 33, wherein the backlight unit further comprises red and green quantum dots excited by the blue light emitted from the blue LED light source to emit red light and green light, respectively.

35. The display device of claim 33, wherein the backlight unit is configured to emit white light, and the liquid crystal panel further comprises a blue color filter configured to transform the white light passing through the liquid crystal layer into blue light.

36. The display device of claim 33, wherein the backlight unit is configured to emit blue light.

* * * * *